(12) United States Patent
Ito et al.

(10) Patent No.: US 8,201,568 B2
(45) Date of Patent: Jun. 19, 2012

(54) LIQUID TREATMENT APPARATUS

(75) Inventors: Norihiro Ito, Koshi (JP); Hidemasa Aratake, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 433 days.

(21) Appl. No.: 12/533,743

(22) Filed: Jul. 31, 2009

(65) Prior Publication Data
US 2010/0031980 A1   Feb. 11, 2010

(30) Foreign Application Priority Data
Aug. 6, 2008   (JP) .................. 2008-203401

(51) Int. Cl.
*B08B 7/00*   (2006.01)
*B08B 7/04*   (2006.01)
*B08B 3/00*   (2006.01)
*B08B 3/04*   (2006.01)

(52) U.S. Cl. ........... 134/104.2; 134/56 R; 134/58 R; 134/147; 134/157; 134/186; 134/902

(58) Field of Classification Search ........... 134/104.2, 134/56 R, 57 R, 58 R, 147, 157, 186, 902; 118/52
See application file for complete search history.

(56) References Cited

U.S. PATENT DOCUMENTS
| 4,941,426 | A  | * | 7/1990  | Sago et al. ............... 118/52 |
| 6,207,231 | B1 | * | 3/2001  | Tateyama ................. 427/240 |
| 6,458,208 | B1 | * | 10/2002 | Anai et al. ............... 118/52 |
| 6,565,656 | B2 | * | 5/2003  | Sada et al. ............... 118/50 |

FOREIGN PATENT DOCUMENTS
JP   2005-86123 A   3/2005

* cited by examiner

*Primary Examiner* — Alexander Markoff
(74) *Attorney, Agent, or Firm* — Abelman, Frayne & Schwab

(57) ABSTRACT

Disclosed is a liquid treatment apparatus capable of effectively exhausting processing liquid atmosphere around a target object. The liquid treatment apparatus includes a container, a support part located within the container that supports the target object, a rotation driving mechanism to rotate the target object supported by the support part, a processing liquid supply mechanism to supply a processing liquid to the target object, and a rotation cup, which is located outside of the outer circumference of the target object and is rotatable together with the support part. A rotation exhaust cup is arranged above the rotation cup and is rotatable together with the rotation cup. A discharge mechanism discharges processing liquid atmosphere guided by the rotation cup and the rotation exhaust cup.

6 Claims, 2 Drawing Sheets

LIQUID TREATMENT APPARATUS

This application is based on, and claims priority from, Japanese Patent Application No. 2008-203401, filed on Aug. 6, 2008 with the Japanese Patent Office, the disclosure of which is incorporated herein in its entirety by reference.

TECHNICAL FIELD

The present invention relates to a liquid treatment apparatus, which supplies processing liquid to a target object and processes the target object.

BACKGROUND

Generally, a substrate processing apparatus (for example, liquid treatment apparatus) includes a chamber (for example, an container) having an exhaust port to vent gas, a scatter preventing cup, which is disposed in the chamber and has an exhaust port to vent gas, an exhaust means, a chamber exhaust tube connected to the exhaust port of the chamber, an exhaust tube of scatter preventing cup connected to the exhaust port of the scatter preventing cup, and a damper to selectively connect the exhaust means to either the exhaust port of the chamber or the exhaust port of the scatter preventing cup. An exemplary liquid treatment apparatus is disclosed in Japanese Unexamined Patent Publication No. 2005-86123.

The liquid treatment apparatus can guide and vent gas in the scatter-preventing cup by means of the scatter-preventing cup. However, the liquid treatment apparatus cannot effectively guide the processing liquid atmosphere (that includes liquid droplets as well as gasified processing liquid) around and above a target object to an exhaust mechanism.

SUMMARY

According to one embodiment, a liquid treatment apparatus for processing a target object is provided. The liquid treatment apparatus includes a container, a support part located within the container to support a target object, a rotation driving mechanism to rotate the target object supported by the support part, a processing liquid supply mechanism to supply processing liquid to the target object, a rotation cup that is located outside of the outer circumference of the target object and is rotatable together with the support part, a rotation exhaust cup that is arranged above the rotation cup and is rotatable together with the rotation cup, and a discharge mechanism to discharge processing liquid atmosphere guided by the rotation cup and rotation exhaust cup.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present invention provides a liquid treatment apparatus capable of effectively exhausting processing liquid atmosphere around a target object.

According to one embodiment, a liquid treatment apparatus for processing a target object is provided. The liquid treatment apparatus includes a container, a support part located within the container to support a target object, a rotation driving mechanism to rotate the target object supported by the support part, a processing liquid supply mechanism to supply processing liquid to the target object, a rotation cup that is located outside of the outer circumference of the target object and is rotatable together with the support part, a rotation exhaust cup that is arranged above the rotation cup and is rotatable together with the rotation cup, and a discharge mechanism to discharge processing liquid atmosphere guided by the rotation cup and rotation exhaust cup.

A lid is arranged over the rotation exhaust cup and covers at least a part of an upper surface of the rotation exhaust cup.

The discharge mechanism includes an inner discharge channel, through which the processing liquid atmosphere guided by the rotation cup is channeled, and an outer discharge channel, through which the processing liquid atmosphere guided by the rotation exhaust cup is channeled.

The discharge mechanism includes a discharge tube to channel the processing liquid atmosphere guided there by the rotation cup and rotation exhaust cup. The discharge tube includes a dispersion plate to partition the discharge tube. One area of the discharge tube partitioned by the dispersion plate forms the inner discharge channel, and the other area of the discharge tube partitioned by the dispersion plate forms the outer discharge channel.

The dispersion plate is slidable within the discharge tube. A balance between quantities of the processing liquid atmosphere discharged through the inner and outer discharge channels is controlled.

The inner discharge channel includes an inner control mechanism to control a flow quantity of the processing liquid atmosphere guided through the inner discharge channel. The outer discharge channel includes an outer control mechanism to control a flow quantity of the processing liquid atmosphere guided through the outer discharge channel. The flow quantity of the processing liquid atmosphere discharged through the inner and outer discharge channels is independently controlled.

Figure 1:
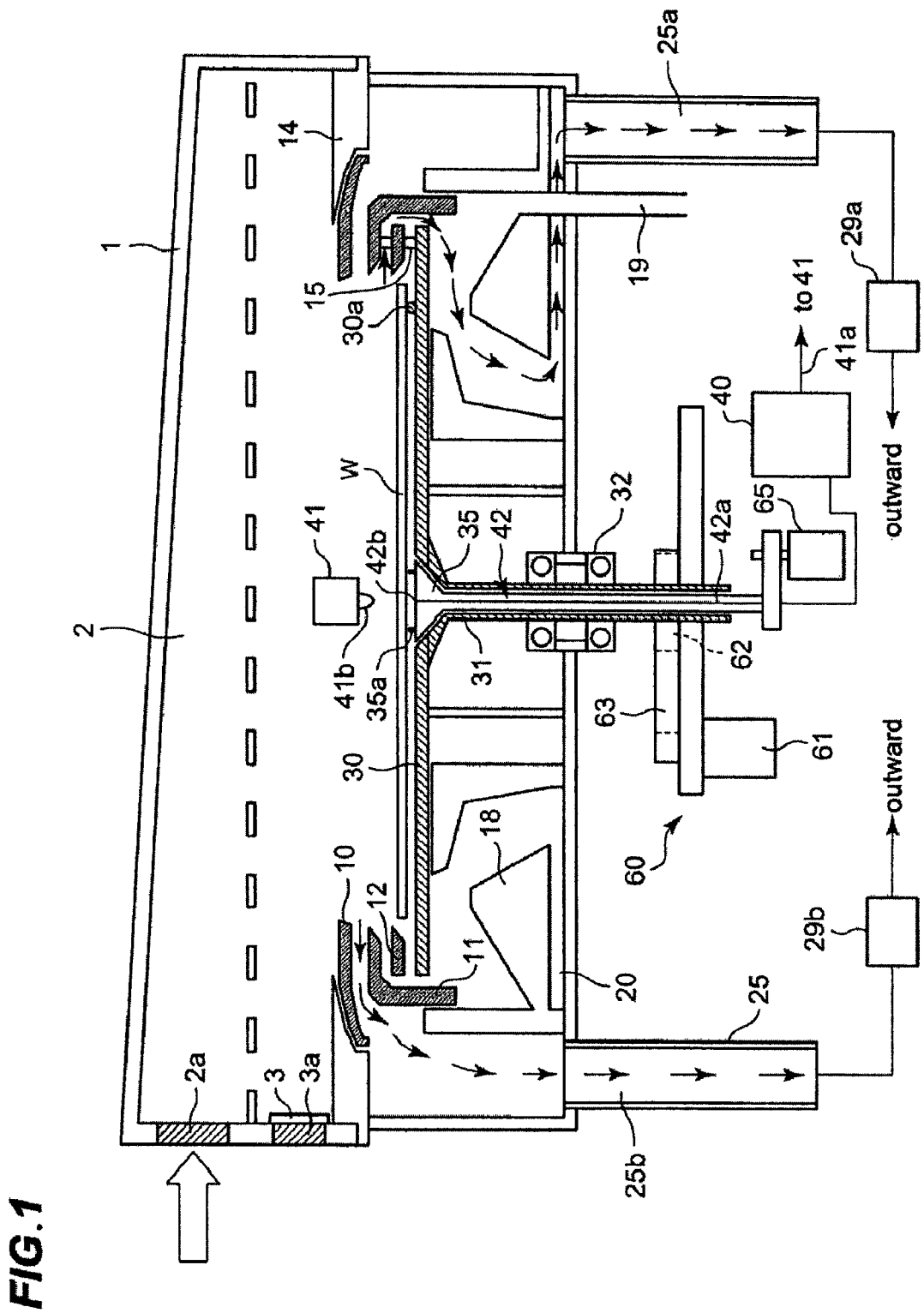
FIG. 1 is a schematic diagram illustrating a liquid treatment apparatus according to one embodiment of the present invention.
Figure 2:
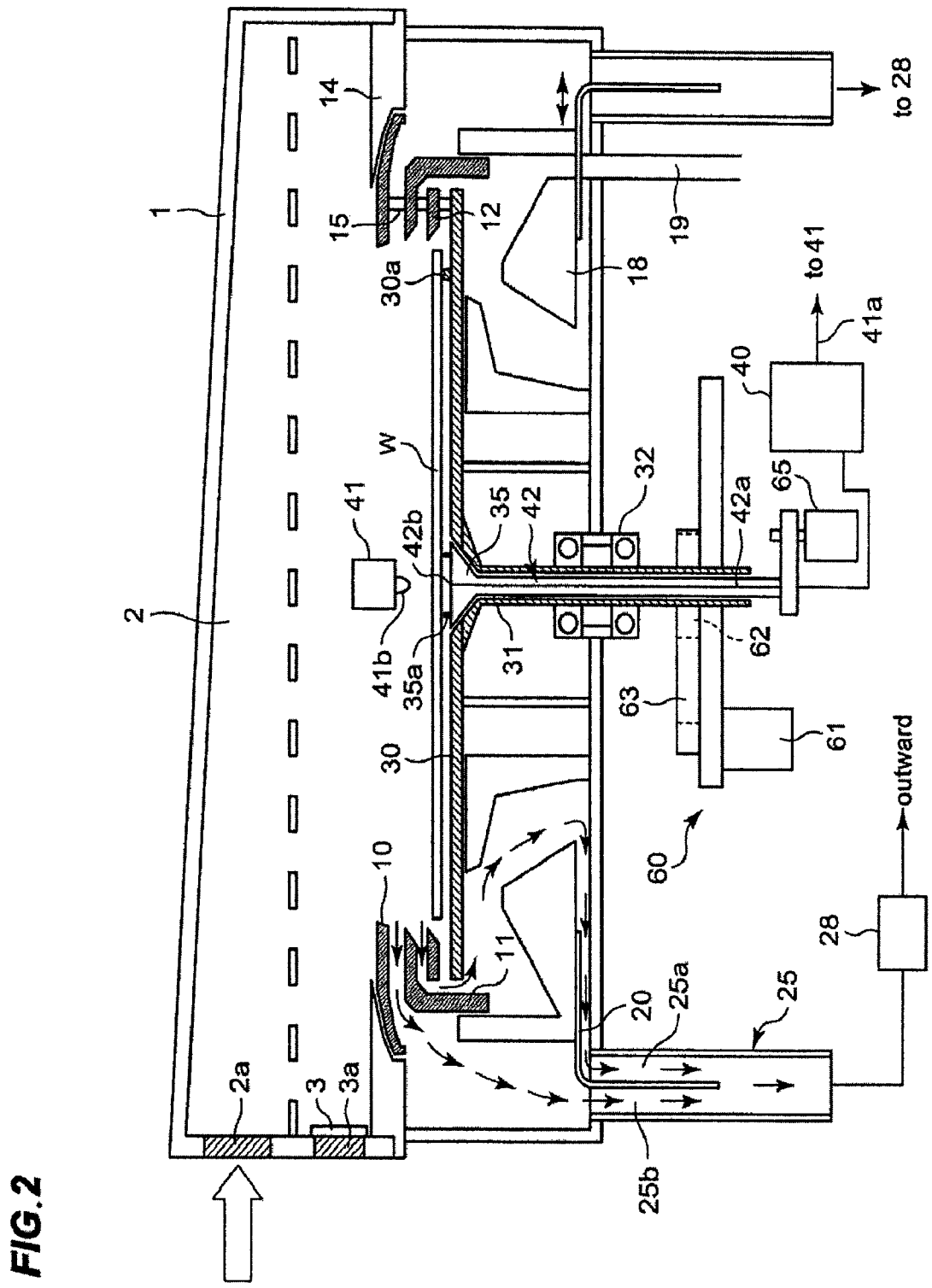
FIG. 2 is a schematic diagram illustrating a liquid treatment apparatus according to another embodiment of the present invention.

Hereinafter, embodiments of the present invention will be described with reference to the accompanying drawings. FIGS. 1 and 2 illustrate embodiments of the present invention.

A liquid treatment apparatus according to one embodiment processes a wafer W, which is a target object, by supplying processing liquid to the wafer.

As shown in FIG. 1, a liquid treatment apparatus includes a chamber (container) 1, a support plate 30 located within chamber 1 that has support pins (support parts) 30a supporting a wafer W, a rotation shaft 31 extending downward from support plate 30, a rotation driving mechanism 60 to rotate wafer W supported by support pins 30a by rotating rotation shaft 31, and a processing liquid supply mechanism (which will be described later in detail) to supply processing liquid to wafer W. Further, support plate 30 has multiple (for example, three) support pins 30a, although FIG. 1 shows only one of the multiple support pins.

Further, as shown in FIG. 1, both support plate 30 and rotation shaft 31 have a hollow shape. Still further, a lift member 35 having lift pins 35a capable of supporting the rear side of wafer W extends within (through the hollow inside of) support plate 30 and rotation shaft 31. Lift member 35 is connected to a lift operating member 65 to move lift member 35 up and down.

As shown in FIG. 1, the processing liquid supply mechanism includes a surface side processing liquid supply part 41 to supply the processing liquid to a front surface (upper surface) of wafer W, a rear side processing liquid supply part 42 to supply the processing liquid to a rear surface (lower surface) of wafer W, and a processing liquid supply source 40 to supply the processing liquid to front surface side processing liquid supply part 41 and rear side processing liquid supply part 42. Rear side processing liquid supply part 42 can supply not only the processing liquid, but also a nitrogen gas to the rear surface of wafer W.

Front surface side processing liquid supply part 41 includes a front surface side processing liquid supply nozzle 41b to supply the processing liquid to the front surface of wafer W and a front surface side processing liquid supply tube 41a to guide the processing liquid supplied by processing liquid supply source 40 to front surface side processing liquid supply nozzle 41b. Rear side processing liquid supply part 42 includes a rear side processing liquid supply port 42b to supply the processing liquid to the rear surface of wafer W and a rear side processing liquid supply tube 42a to guide the processing liquid supplied from processing liquid supply source 40 to rear side processing liquid supply port 42b.

As used herein, the term, "washing solution" refers to chemical solution or rinse solution. As example of the chemical solution, there is diluted hydrofluoric acid, ammonia hydrogen peroxide (SCI), or isopropyl alcohol (IPA). Pure water (de-ionized water; DIW) may be used as the rinse solution. Further, isopropyl alcohol (IPA) may be used as drying solution to dry wafer W.

Further, as shown in FIG. 1, rotation driving mechanism 60 includes a pulley 62 disposed around the outer circumference of rotation shaft 31, a driving belt 63 wound around pulley 62, and a motor 61 to provide driving force to driving belt 63 so as to rotate rotation shaft 31 by means of pulley 62. Bearings 32 are disposed around the outer circumference of rotation shaft 31.

As shown in FIG. 1, a rotation cup 11, which is rotatable, is arranged outside of the outer circumference of wafer W, and a rotation exhaust cup 10, which is rotatable together with rotation cup 11, covers the upside of rotation cup 11. Further, under rotation cup 11, a guide member 12 is disposed at the outside of the outer circumference of wafer W, supported by support pins 30a, with a gap from the outer circumference of the wafer (see FIG. 1). Also, rotation exhaust cup 10, rotation cup 11, and guide member 12 are connected to each other through a plurality of columns 15 (see FIG. 1).

As shown in FIG. 1, a lid 14 is disposed above rotation exhaust cup 10 and covers the upper surface of an outer peripheral portion of rotation exhaust cup 10. Lid 14 extends outward beyond the outer circumference of rotation exhaust cup 10 up to an inner wall of chamber 1 (see FIG. 1).

As shown in FIG. 1, a discharge mechanism to discharge the processing liquid atmosphere, having been guided by rotation cup 11 and rotation exhaust cup 10, is arranged in chamber 1. The discharge mechanism includes discharge tubes 25, which extend downward from chamber 1, and a suction part 28, which includes a suction pump provided at discharge tube 25. Further, although the present embodiment employs two discharge tubes 25, the present invention is not limited thereto.

As used herein, the term, "processing liquid atmosphere" refers to atmosphere, which includes scattered droplets of the processing liquid having been supplied to wafer W and gasified processing liquid having been gasified after or during its application to wafer W.

Further, as shown in FIG. 1, a dispersion plate 20 is arranged within and partitions discharge tube 25. Moreover, an inner area (one side) of discharge tube 25, partitioned by dispersion plate 20, forms an inner discharge channel 25a, which channels the processing liquid atmosphere guided by the inner circumferential surface of rotation cup 11. An outer area (the other side) of discharge tube 25, partitioned by the dispersion plate 20, forms an outer discharge channel 25b, which channels the processing liquid atmosphere guided by the inner circumferential surface of rotation exhaust cup 10.

Dispersion plate 20 described above is attached to the lower surface of a drainage cup 18, which will be described later in more detail. Dispersion plate 20 first extends in the horizontal direction from the lower surface of drainage cup 18, is bent, and then extends downward within discharge tube 25. Thus, dispersion plate 20 can keep the balance between the quantity of the processing liquid atmosphere discharged through inner discharge channel 25a and the quantity of the processing liquid atmosphere discharged through outer discharge channel 25b.

As shown in FIG. 1, at an upper part within chamber 1 is a gas introduction section 2 to introduce a gas through a gas introduction port 2a from a fan-filter unit (FFU; not shown) of liquid processing system, which is arranged to supply fresh air (gas) to wafer W from above.

As shown in FIG. 1, an in-out port 3a for entrance and exit of wafer W is arranged at one side of an upper portion of chamber 1, and in-out port 3a has a shutter member 3 to open and close in-out port 3a.

As shown in FIG. 1, a drainage cup 18 is arranged under rotation exhaust cup 10, rotation cup 11, and guide member 12. Drainage cup 18 collects and retrieves the processing liquid after processing wafer W. Drainage cup 18 is connected to a drainage tube 19, and drainage tube 19 is provided with a drainage pump (not shown) to provide suction force to the processing liquid within drainage tube 19. The processing liquid, having been sucked by the drainage pump, is returned to processing liquid supply source 40 for reuse (see FIG. 1).

Dispersion plate 20 is slidable in the horizontal direction within drainage tube 25 (see FIG. 1). Therefore, dispersion plate 20 can adjust the balance between the quantities of processing liquid atmosphere discharged through inner and outer discharge channels 25a and 25b.

Hereinafter, the operation of a liquid treatment apparatus, according to the present embodiment and having the construction described above will be described.

Shutter member 3 disposed at one side of an upper portion of chamber 1 moves and opens in-out port 3a (see FIG. 1).

A wafer-carrying robot (not shown) holding wafer W is inserted into chamber 1 through in-out port 3a (see FIG. 1). In this case, lift-operating member 65 locates lift member 35 at its upper position (at which the wafer-carrying robot delivers wafer W onto lift member 35).

Lift pins 35a of lift member 35 take wafer W from the wafer-carrying robot. Wafer W is supported by lift pins 35a. The wafer-carrying robot then moves out of chamber 1 through in-out port 3a, and shutter member 3 closes in-out port 3a.

Lift operating member 65 locates lift member 35 at its lower position (see FIG. 1). When lift member 35 is located at its lower position, the rear surface of wafer W is supported by support pins 30a of support plate 30.

Rotation driving part 60 rotates rotation shaft 31, which rotates support plates 30. Thus, wafer W, supported by support pins 30a of support plate 30, also rotates (see FIG. 1). The rotation of rotation shaft 31 is caused by driving force provided to pulley 62 through driving belt 63 from motor 61.

Surface side processing liquid supply part 41 supplies the processing liquid to a central portion of the surface of wafer W, supported by support pins 30a, of support plate 30 (see FIG. 1). At this time, rear side processing liquid supply part 42 supplies the processing liquid to a central portion of the rear surface of wafer W supported by support pins 30a of support plate 30 (see FIG. 1).

In the present embodiment, both surface side processing liquid supply part 41 and rear side processing liquid supply part 42 first supply ammonia hydrogen peroxide (SC1) as the first chemical solution, and then supply pure water (DIW) as the rinse solution. Thereafter, surface side processing liquid supply part 41 and rear side processing liquid supply part 42 supply diluted hydrofluoric acid (HF) as the second chemical solution, and then supply pure water (DIW) as the rinse solution. Thereafter, surface side processing liquid supply part 41 supplies IPA, which is a drying solution (third chemical solution), to the surface of wafer W, and rear side processing liquid supply part 42 supplies a nitrogen gas to the rear side of wafer W.

The processing liquid supplied as described above, after processing wafer W, passes through rotation cup 11 and guide member 12 and reaches drainage cup 18. Then, the processing liquid drains out of the liquid treatment apparatus through drainage tube 19 connected to drainage cup 18.

Meanwhile, the processing liquid atmosphere passes through rotation exhaust cup 10 and rotation cup 11, is guided into discharge tube 25, and is then discharged out of discharge tube 25. The suction force, provided by suction part 28, is applied to the discharged processing liquid atmosphere.

According to the present embodiment, rotation cup 11 is located outside of the outer circumference of the target object (wafer W) and rotates together with wafer W (see FIG. 1). Therefore, although the processing liquid atmosphere has been provided with rotation force by the rotation of wafer W, rotation cup 11, in comparison with a fixed cup, serves to better guide the processing liquid atmosphere.

Further, in the present embodiment, rotation exhaust cup 10 rotates together with wafer W and rotation cup 11, and is disposed above and covers rotation cup 11 (see FIG. 1). Thus, not only can the inner circumferential surface of rotation cup 11 guide the liquid state processing liquid and the processing liquid atmosphere, but rotation exhaust cup 10 can also guide the excess processing liquid atmosphere, which is not guided and discharged by rotation cup 11 (because of the distanced above wafer W).

Thus, the present embodiment can effectively discharge the processing liquid atmosphere around and above wafer W within chamber 1.

If the used chemical solution atmosphere (droplets of the chemical solution and gasified chemical solution) remains in chamber 1 during another processing step (for example, another chemical solution processing step, rinsing step, or drying step), it may cause particles on wafer W. However, according to the present embodiment, since the processing liquid atmosphere around wafer W can be effectively discharged within chamber 1 as described above, the used chemical solution atmosphere can be prevented from remaining in another processing step. Thus, the occurrence of such particles can be prevented.

Further, in the present embodiment, since lid 14 is disposed above rotation exhaust cup 10 and covers the upper surface of an outer peripheral portion of rotation exhaust cup 10 (see FIG. 1), it is possible to prevent the processing liquid atmosphere from entering above rotation exhaust cup 10 after passing through the inner circumferential surface of rotation exhaust cup 10. Lid 14 can also prevent a vortex flow, which may occur due to the rotation of rotation exhaust cup 10. Thus, it is possible to more effectively discharge the processing liquid atmosphere around the wafer W.

Further, according to the present embodiment, since dispersion plate 20 is slidable within discharge tube 25 (see FIG. 1), the widthwise size of inner discharge channel 25a and outer discharge channel 25b can be properly adjusted according to the type or quantity of the used processing liquid. Therefore, the balance between the quantity of the processing liquid atmosphere discharged through inner discharge channel 25a and the quantity of the processing liquid atmosphere discharged through outer discharge channel 25b can be controlled. Further, it is possible to more effectively discharge the processing liquid atmosphere around wafer W.

When the processing of the surface and rear side of wafer W is completed as described, the supply of IPA is interrupted. Thereafter, rotation driving part 60 rotates wafer W at a high speed, and dries wafer W (see FIG. 1).

Lift operating member 65 moves lift member 35 to its upper position. When lift member 35 is moved up to its upper position, wafer W located on support pins 30a of support plate 30 is supported and moved up by lift pins 35a of lift member 35. Then, shutter member 3 moves and opens in-out port 3a.

The wafer-carrying robot is inserted into chamber 1 through in-out port 3a. Then, the wafer-carrying robot picks up wafer W on lift pins 35a of lift member 35, so that wafer W is removed from lift pins 35a.

In the present embodiment described above, the inner area partitioned by dispersion plate 20 forms inner discharge channel 25a, and the outer area partitioned by dispersion plate 20 forms outer discharge channel 25b. However, the present invention is not limited to the construction described above and, instead, may employ a construction as shown in FIG. 2, in which, from among two discharge tubes 25, one discharge tube 25 forms inner discharge channel 25a, which channels the processing liquid atmosphere guided by rotation cup 11, and the other discharge tube 25 forms outer discharge channel 25b, which channels the processing liquid atmosphere guided by rotation exhaust cup 10.

For example, inner discharge channel 25a can be provided with an inner damper (inner control mechanism) 29a to control the flow quantity of the processing liquid atmosphere guided through inner discharge channel 25a. Further, outer discharge channel 25b can be provided with an outer damper (outer control mechanism) 29b to control the flow quantity of the processing liquid atmosphere guided through outer discharge channel 25b. Thus, it is possible to independently control the flow quantity of the processing liquid atmosphere discharged through inner discharge channel 25a and outer discharge channel 25b (see FIG. 2).

According to the present embodiment, it is possible to exactly control the flow quantity of processing liquid atmosphere discharged through inner discharge channel 25a and outer discharge channel 25b, and to more effectively discharge the processing liquid atmosphere around wafer W.

According to the present invention, a rotation cup, which is rotatable, is arranged outside of an outer circumference of a target object, and a rotation exhaust cup rotating together with the rotation cup is arranged above the rotation cup. Therefore, it is possible to effectively discharge the processing liquid atmosphere around the target object.

From the foregoing, for the purpose of the present disclosure, the various embodiments of the present disclosure have been described herein for purposes of illustration, and various modifications may be made without departing from the scope and spirit of the present disclosure. Accordingly, the various embodiments disclosed herein are not intended to be limiting as to the true scope and spirit of the disclosure are, which are indicated by the following claims.

What is claimed is:

1. A liquid treatment apparatus for processing a target object, comprising:
    a container;
    a support part located within the container and supporting a target object;
    a rotation driving mechanism to rotate the target object supported by the support part;
    a processing liquid supply mechanism to supply processing liquid to the target object;
    a rotation cup that is located outside of an outer circumference of the target object covering at least an upper portion of the target object and is rotatable together with the support part;
    a drainage cup configured to surround an outer circumference of the rotation cup;
    a rotation exhaust cup that is arranged above the rotation cup and is rotatable together with the rotation cup; and
    a discharge mechanism to discharge processing liquid atmosphere guided by the rotation cup and the rotation exhaust cup,
    wherein the processing liquid atmosphere guided by an inner surface of the rotation cup is exhausted through the drainage cup, and the processing liquid atmosphere guided by a gap formed between the rotation cup and the rotation exhaust cup is exhausted over an outer wall of the drainage cup.

2. The liquid treatment apparatus of claim 1, further comprising a lid arranged over the rotation exhaust cup, the lid covering at least a part of an upper surface of the rotation exhaust cup.

3. The liquid treatment apparatus of claim 1, wherein the discharge mechanism comprises an inner discharge channel, through which the processing liquid atmosphere guided by the rotation cup is channeled, and an outer discharge channel, through which the processing liquid atmosphere guided by the rotation exhaust cup is channeled.

4. The liquid treatment apparatus of claim 3, wherein the discharge mechanism comprises a discharge tube to channel the processing liquid atmosphere guided by the rotation cup and the rotation exhaust cup, wherein the discharge tube comprises a dispersion plate that extends in a horizontal direction from a lower surface of the drainage cup and bent downwardly within the discharge tube to partition the discharge tube, and wherein one area of the discharge tube partitioned by the dispersion plate forms the inner discharge channel, and the other area of the discharge tube partitioned by the dispersion plate forms the outer discharge channel.

5. The liquid treatment apparatus of claim 4, wherein the dispersion plate is slidable within the discharge tube, and wherein a balance between quantities of the processing liquid atmosphere discharged through the inner and outer discharge channels is controlled by adjusting a sliding amount of the dispersion plate within the discharge tube.

6. The liquid treatment apparatus of claim 3,
    wherein the inner discharge channel comprises a first discharge tube provided with an inner control mechanism to control a flow quantity of the processing liquid atmosphere guided through the inner discharge channel,
    wherein the outer discharge channel comprises a second discharge tube provided with an outer control mechanism to control a flow quantity of the processing liquid atmosphere guided through the outer discharge channel, and
    wherein the flow quantity of the processing liquid atmosphere discharged through the inner and outer discharge channels is independently controlled by the inner and the outer control mechanisms.

* * * * *